(12) United States Patent
Redding

(10) Patent No.: US 7,014,527 B2
(45) Date of Patent: Mar. 21, 2006

(54) DIE LEVEL TESTING USING MACHINE GROOVED STORAGE TRAY WITH VACUUM CHANNELS

(75) Inventor: Gary Daniel Redding, Victor, NY (US)

(73) Assignee: Xerox Corporation, Stamford, CT (US)

( * ) Notice: Subject to any disclaimer, the term of this patent is extended or adjusted under 35 U.S.C. 154(b) by 197 days.

(21) Appl. No.: 10/737,517

(22) Filed: Dec. 16, 2003

(65) Prior Publication Data

US 2005/0127930 A1    Jun. 16, 2005

(51) Int. Cl.
*B24B 1/00*    (2006.01)
(52) U.S. Cl. .................................. 451/5; 451/8; 451/41
(58) Field of Classification Search .............. 206/264, 206/710; 324/754, 756, 758, 759, 760, 765, 324/766; 451/5, 8, 28, 41
See application file for complete search history.

(56) References Cited

U.S. PATENT DOCUMENTS 3,949,295 A * 4/1976 Moorshead ................. 324/760
4,953,283 A 9/1990 Kawabata et al.
5,519,514 A 5/1996 TeWinkle .................... 358/514
5,543,838 A 8/1996 Hosier et al. ................ 348/311
5,604,362 A 2/1997 Jedlicka et al. .............. 257/233
5,687,297 A 11/1997 Coonan et al. ............... 395/102
5,808,297 A 9/1998 Jedlicka et al. .............. 250/226
5,907,246 A 5/1999 Abraham et al.
6,069,624 A 5/2000 Dash et al. .................. 345/333
6,111,417 A 8/2000 Kojima
2001/0043076 A1 11/2001 Itasaka et al.

FOREIGN PATENT DOCUMENTS

EP    0 967 848 A3    12/1999

* cited by examiner

*Primary Examiner*—Timothy V. Eley
(74) *Attorney, Agent, or Firm*—Oliff & Berridge, PLC

(57) ABSTRACT

A method for testing dies using a machine grooved storage tray with vacuum channels. The method involves drawing a vacuum upon the dies while held in the storage tray and using an automated vision system to map the location of dies in the pockets of the storage tray. Using the map, the storage tray is maneuvered for 5 each individual die in relation to a test probe in order that contact and testing may be made between the discrete die and the test probe.

22 Claims, 7 Drawing Sheets

DIE LEVEL TESTING USING MACHINE GROOVED STORAGE TRAY WITH VACUUM CHANNELS

CROSS REFERENCE

Reference is made to common-assigned copending U.S. patent application Ser. No. 10/736,734 filed herewith, entitled "Die Storage Tray Having Machined Grooves and Vacuum Channels", by Gary Daniel Redding, the disclosure(s) of which are incorporated herein.

BACKGROUND AND SUMMARY

Full-width arrays comprised of adjoined or butted semiconductor chips are increasingly common for scanning, imaging, and printing applications. Such full-width arrays are used as printheads in ink jet printing, monochrome and color scanner bars, and, for some applications, digital image capture applications.

A typical full-width array is comprised of a series of discrete chips butted or otherwise adjoined in order to obtain the appropriate length necessary to cover a "full-width". For many printing applications, such "full-width" is 11 inches or more in order to enable printing or scanning of standard 8.5×11 B4 paper. When edge butted together, such chips form an imaging bar of the desired length. Such a bar is rigidly mounted into a bar fixture having appropriate electrical contacts and features appropriate for mounting and electrically connecting the entire full-width assembly to the equipment into which it is placed. While monochrome imaging bars require only one row of sensing elements, color imaging bars are provided with at least three different color filters, such as red, green and blue, overlying three or more rows of closely spaced light sensor elements (photosites), to provide electrical output signals corresponding to the colors of the document image being scanned. Details of typical full-width color scanning arrays are taught by patents such as U.S. Pat. Nos. 5,808,297, 5,543,838, 5,550,663, 5,604,362, and 5,519,514,all of which are hereby incorporated herein by reference.

Typical fabrication of a full-width array is explained in relation to FIGS. 1–3. Referring first to FIG. 1, a silicon wafer 10 is shown with discrete chips formed thereon. For exemplary purposes, several discrete chips are labeled 11 although, as indicated in FIG. 1, hundreds of chips are formed on the same silicon wafer. The blackened edge regions represent chips that must be discarded due to known edge defects. Formation of the wafer and the chips is pursuant well-known semiconductor techniques. For applications such as full-color scanner, colorimeter, and other imaging applications, portions of each chip may be coated while in situ on the wafer with various filters in order to render portions of the chip sensitive to various wavelengths. The wafer can be of any size, and wafer sizes of 5 inches and more are now standard in the industry.

Referring to FIG. 2, a close-up of an individual chip 11 is shown. Such chip is for a scanner array, but those skilled in the art will recognize that the embodiments described herein apply to a wide range of chips, especially those to be formed into full-width arrays. In the orthogonal elevated view of FIG. 2, 4 rows of sensor pixels are shown in region 12. Row 13 has no light filter on top of it and is accordingly optimized for monochrome sensing. Filters are coated on the other three rows while in situ on the wafer. The filters optimize each of the three rows identified as 14 for red, green blue, respectively, or for some other color space such as cyan, yellow, and magenta. With such filters, chip 11 can serve as a monochrome scanner and as a process color scanner. Chip 11 contains much internal circuitry (not shown). Interface with chip 11 is accomplished through the various contact points, or pads, shown in region 15. Input and output through various of these pads controls the timing configuration, power requirements, and data inputs and outputs required for the chip to capture and then transmit its scanning data. In the embodiment of a full-width array chip 11 shown, each of the pads measures approximately 0.004 inches by 0.007 inches.

Referring again to FIG. 1, it is possible and standard in the art to test each discrete chip 11 while in situ on the wafer. To do so, the temperature of the wafer is elevated to between about 50 and about 60 degrees centigrade. Once the temperature is elevated, each pad 15 of the chip undergoing testing must be located and contacted simultaneously. The precision required to locate and simultaneously place a test probe on each of the 15 or more pads per chip (18 are shown in FIG. 2), in turn requires an automated vision system for efficient manufacturing. Companies such as Cognex Corporation make suitable machine vision system. When dies are regularly spaced in situ on a wafer such as shown in FIG. 1, a machine vision system can operate by finding the precise location of positioning markings on the wafer. Once these markings are determined, then each of the dies on the wafer and each of the pads on the dies become known. Once the location of the pads are mapped into an X-Y grid by the vision system, the map can be passed to a test probe system such as those made by Electroglas, Inc. The test probe system uses the X-Y map to find and test the appropriate pads. Generally, the probe itself remains stationary while the wafer, mounted on a stage, is raised and lowered in a step and repeat fashion until all eligible die on the wafer have been tested.

One complication to the above test procedure is that even small amounts of oxide on the pads may hinder good electrical contact. To avoid false negative results due to poor electrical contact between the pads and the probe, the probe is designed to move in a scraping or scrubbing motion over the pads in order to scrape oxides from the pads and to thereby enhance electrical contact. The intended result is that each chip 11 can be reliably tested while within the wafer. The location of defective chips is recorded, and after cutting the chips from the wafer, defective chips are discarded in a sorting process.

The cutting process of a wafer may involve processes including attaching a UV release film to the face of the wafer in order that it can be flipped and score cut from the reverse side. The UV film is then cured with UV exposure to facilitate its non-destructive removal. The wafer is then turned again and placed on nittotape to stabilize it while it is through cut from the front side within a film frame. After through cutting, the discrete dies, or chips, are sorted by being picked from the nittotape, transported, and placed into a storage tray, or wafflepack, and stored until assembled into a final product.

Although the present invention applies to a wide variety of dies cut from wafers, it is explained in particular in relation to dies, or chips, intended for fabrication into full-width imaging arrays. Manufacture of a full-width array from discrete chips 11 involves selection of a required number of chips, aligning such chips precisely in a fixture (generally in a line), and permanently fastening the butted and adjoining chips within the fixture. The full-width array is then completed by routing appropriate wires from the pads in region 15 to the appropriate input/output ports of the full-width array and by affixing to the assembly any other mechanical or electrical features needed for operation. For imaging-related chips such as the one shown in FIG. 2 that measure about 16 millimeters long by about 1.0 millimeters wide, approximately 20 chips per array are assembled into a full-width array.

The simplified manufacturing process above is conventional in the art. Closer focus on the process of cutting the chips from the wafer and placing them in the finished array reveals that a significant number of defects in chips are created during the process that cuts the wafer and then during the process that handles, or sorts, the discrete chips after they have been cut from the wafer.

Referring to FIG. 3, a discrete die holding tray of the prior art, sometimes called a "wafflepack", is shown. This wafflepack 16 is used to hold, store, and transport chips such as chips 11 after the chips have been cut from wafer 10. Wafflepack 16 is typically made of a rigid molded plastic such as PVC, ABS, styrene or any similar rigid, non-conductive material. Once cut and sorted, discrete chips 11 are placed within the hundreds of pockets 17 located on each wafflepack. Each pocket has a length dimension and a width dimension corresponding to the comparable dimensions of chips 11. Such die holding trays are made by a number of manufacturers including Entegris, Inc., which markets such trays under the trademark Fluoroware®. The wafflepack shown in FIG. 3 is similar to one of the Fluoroware H44 series of wafflepack trays.

Advantages of the prior art wafflepack include low cost and durability. For its intended purpose of holding, storing, and transporting chips, the wafflepack of the prior art is very adequate. However, it would be desirable to be able to test individual die chips while placed in the wafflepack in order to identify those chips that became defective during the cutting and sorting processes that preceded placement into the wafflepack. Currently, there is no effective means to test each die chip 11 from the time at which it is cut from the wafer until it is assembled into a finished full-width array. The result is that a significant number of assembled full-width arrays are initially assembled with one or more defective chips. At a minimum, these need to be expensively reworked in order to remove the defective chips and insert nominal chips. Worse, some number of full-width arrays are not successfully re-worked, and these arrays must be discarded in their entirety.

Although discrete chips may individually be tested by placement on a test fixture, such discrete chips cannot adequately be tested en masse while placed in storage fixtures such as wafflepacks of the prior art for reasons related to the precision necessary to find the tiny pads 15 and to the stability necessary for the probes to scrape and then maintain electrical contact with the pads. In a conventional plastic wafflepack, the backplate of the wafflepack is not reliably flat. Even slight warpness along the length dimension of chips 11 causes the chip to rock and lose contact with the probes, especially during the scraping operation. Such warpness in the molded plastic is extremely common due to differential curing or molding of the plastic and due to stresses introduced by the structural features of the wafflepack such as raised relief ribbing, etc. Additionally, it is difficult or impossible to eliminate at least a small radius between the bottom and the sidewalls of each pocket 17 using a molding process with plastic. Similarly, molded plastic does not yield precision along the width dimension. The pockets must be wide enough to accept each chip yet any excess width allows the chip to "wiggle" along its width dimension when probed. The result is that each chip can "wiggle" along its width dimension when probed, thereby losing contact between the pads and the probe. Thus, conventional wafflepacks of the prior art cannot hold chips such as chips 11 firmly enough in all axes to enable solid contact between the probe and the tiny pads during the scraping action of the pad and during the testing itself.

It would be desirable to design and manufacture a die storage tray or wafflepack that positions and holds discrete dies in a stable fashion sufficient to permit testing while held in a wafflepack. It would also be desirable to create a test procedure enabling die testing while held in such a wafflepack.

One embodiment of the present invention is a method for testing dies, comprising: placing a plurality of dies in a die holding tray; mounting the holding tray to a mounting stage of an imaging and testing apparatus; drawing a partial vacuum through channels communicating between the bottom of die pockets in the die holding tray and a vacuum source; using an automated vision system to map the position of dies held in the holding tray; with the use of the map, moving the mounting stage in relation to a test probe to the approximate position of an individual die held in the holding tray; skewing the mounting stage in relation to the test probe to align the probe with the pads of the die; contacting the pads with a test probe; and testing the die with the test probe by sending and receiving electrical signals.

Another embodiment of the present invention is a method for testing dies, comprising: placing a plurality of dies in a die holding tray; mounting the holding tray to a mounting stage of an imaging and testing apparatus; drawing a partial vacuum through channels communicating between the bottom of die pockets in the die holding tray and a vacuum source; using an automated vision system to map the position of dies held in the holding tray; with the use of the map, moving the mounting stage in relation to a test probe to align the probe with the pads of the die; contacting the pads with a test probe; and testing the die with the test probe by sending and receiving electrical signals.

DETAILED DESCRIPTION OF AN EMBODIMENT OF THE INVENTION

Figure 1:
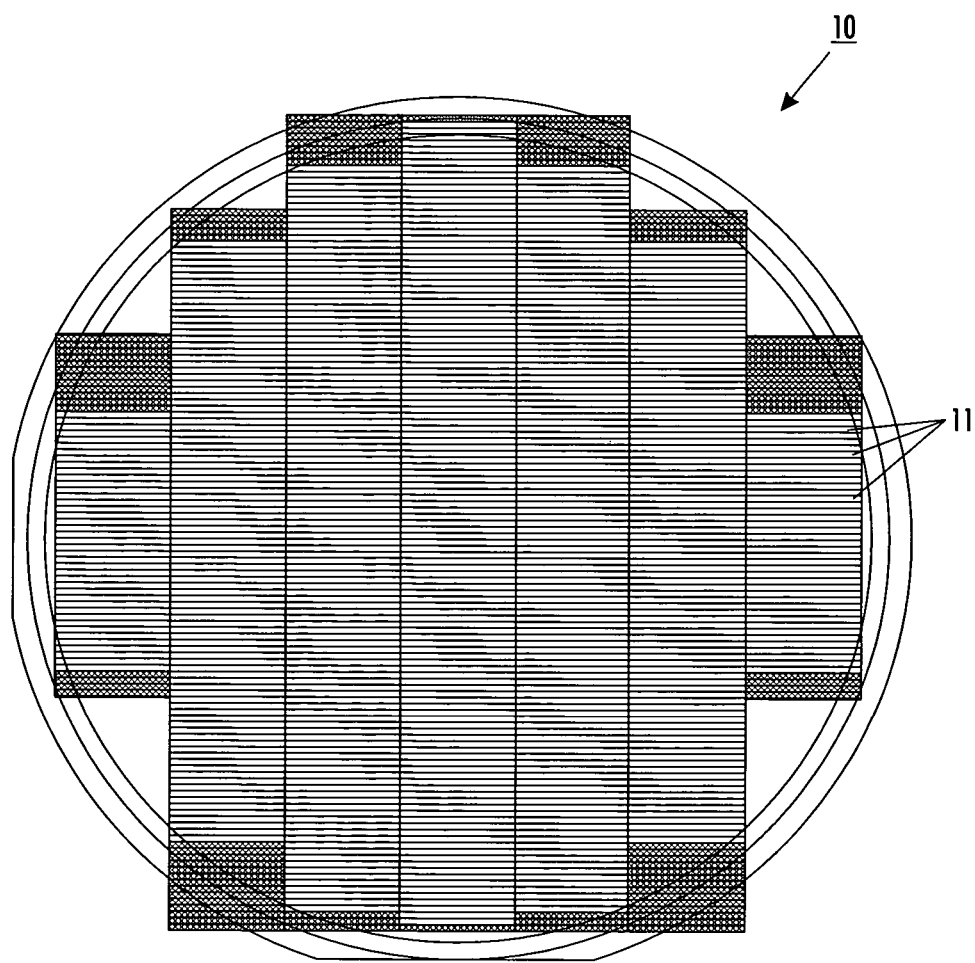
FIG. 1 is an orthogonal elevated view of an uncut wafer of the prior art containing numerous discrete die chips.

For a general understanding of the present invention, reference is made to the drawings. In the drawings, like reference numerals have been used throughout to designate identical elements.

An exemplary electronic system comprising one embodiment of the present invention is a multifunctional printer with print, copy, scan, and fax services. Such multifunctional printers are well known in the art and may comprise print engines based upon ink jet, electrophotography, and other imaging devices. The general principles of electrophotographic imaging are well known to many skilled in the art. Generally, the process of electrophotographic reproduction is initiated by substantially uniformly charging a photoreceptive member, followed by exposing a light image of an original document thereon. Exposing the charged photoreceptive member to a light image discharges a photoconductive surface layer in areas corresponding to non-image areas in the original document, while maintaining the charge on image areas for creating an electrostatic latent image of the original document on the photoreceptive member. This latent image is subsequently developed into a visible image by a process in which a charged developing material is deposited onto the photoconductive surface layer, such that the developing material is attracted to the charged image areas on the photoreceptive member. Thereafter, the developing material is transferred from the photoreceptive member to a copy sheet or some other image support substrate to which the image may be permanently affixed for producing a reproduction of the original document. In a final step in the process, the photoconductive surface layer of the photoreceptive member is cleaned to remove any residual developing material therefrom, in preparation for successive imaging cycles.

The above described electrophotographic reproduction process is well known and is useful for both digital copying and printing as well as for light lens copying from an original. In many of these applications, the process described above operates to form a latent image on an imaging member by discharge of the charge in locations in which photons from a lens, laser, or LED strike the photoreceptor. Such printing processes typically develop toner on the discharged area, known as DAD, or "write black" systems. Light lens generated image systems typically develop toner on the charged areas, known as CAD, or "write white" systems. Embodiments of the present invention apply to both DAD and CAD systems. Since electrophotographic imaging technology is so well known, further description is not necessary. See, for reference, e.g., U.S. Pat. No. 6,069,624 issued to Dash, et al. and U.S. Pat. No. 5,687,297 issued to Coonan et al., both of which are hereby incorporated herein by reference.

Figure 4:
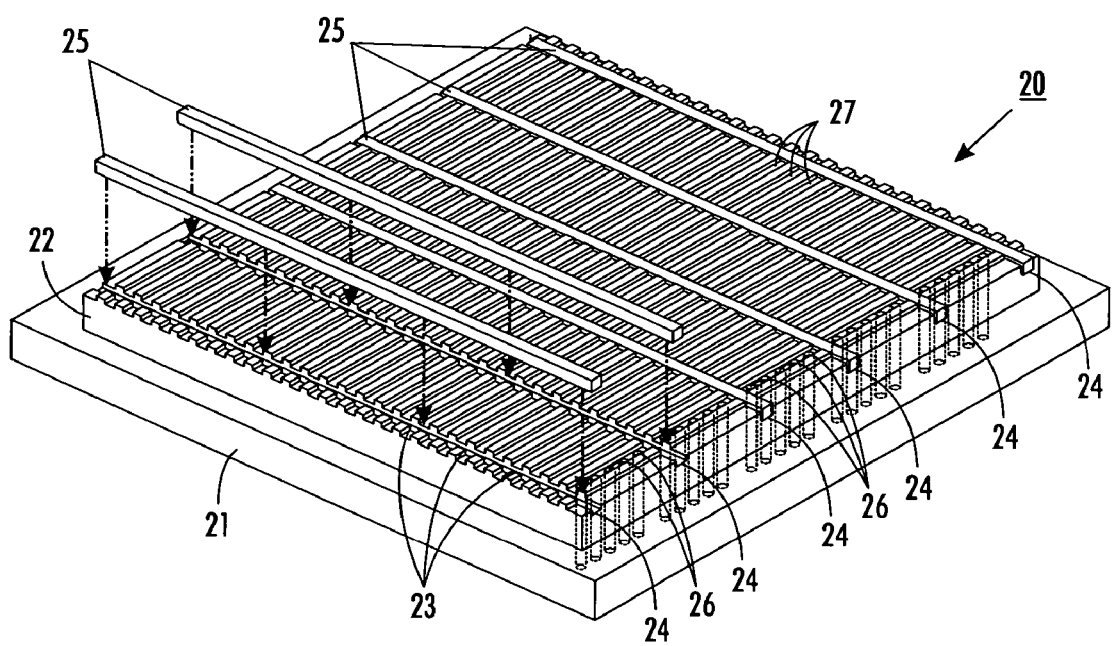
FIG. 4 is an elevated perspective view of one embodiment of a die holding wafflepack tray of the present invention.

One embodiment of a die storage tray wafflepack 20 of the present invention is shown in FIG. 4. In this embodiment, the dimensions of wafflepack 20 are similar to the dimensions of prior art wafflepack 16. Both contain pockets (labeled 27 in FIG. 4) for placement of discrete chips. Differences, however, are four-fold: First, the wafflepack is made of aluminum or some other metal or material capable of forming and holding a flat surface. This is in contrast to the plastic of conventional wafflepacks. In this embodiment, both base plate 21 and raised plate 22 are formed of a single non-deformable material and formed as a single body.

A second difference is that lateral grooves 23 and longitudinal grooves 24 are both machined rather than molded. Such machining enables precisely flat bottoms that are orthogonal to the side and end walls of pockets 27. This is in contrast to the uneven bottoms and corner radii of pockets of conventional wafflepacks that are created by the molding process and that enable discrete dies to wiggle when probed and tested in the wafflepack.

A third difference is that longitudinal grooves 24 are filled with strips 25 separate from the body of the wafflepack (which is formed by base plate 21 and raised plate 22). The need for separate strips 25 to fill grooves 24 is largely the result of the machining of grooves 23. Such machining, in order to form straight sides and square corners for each pocket, cuts lateral grooves 23 from end to end of the raised plate. Longitudinal grooves 24 are cut to enable strips 25 to fill in the longitudinal divides between adjoining pockets 27. Material for strips 25 may be any material that can be formed or machined into straight sides and that is not so brittle as to be unworkable during handling and insertion into grooves 24. Anti-static high-grade neoprene rubber has been shown to be a suitable and compliant material. In one embodiment of a manufacturing process, lateral grooves 23 are machined after longitudinal grooves 24 in order to minimize the chances of burs that interfere with square corners in each pocket 27.

The fourth difference between wafflepack 20 and prior art die holding trays such as wafflepack 16 is the boring of vacuum channels 26 through the base plate 21 and raised plate 22 into the bottom of each pocket 27. The purpose of such holes is to enable a vacuum to be drawn on each pocket 27 through channels 26. The drawing of such vacuum is accomplished using a vacuum fixture that seats onto the back of wafflepack 20 and seals its edges while providing a cavity across the area of raised plate 22. As a vacuum is pulled in such cavity, such vacuum is communicated through each of channels 26 to each pocket 27. In one embodiment, such holes are bored in a two step process to minimize burring and maximize vacuum draw. Counterbored holes of comparatively large diameter are bored at least partially through base plate 21. Through holes are then drilled through the raised plate 22 into each of the counterbored holes.

The efficacy of the vacuum draw upon dies in wafflepack 20 depends upon a number of factors. First, the flatness of each pocket bottom is important for creating a seal between the die and the vacuum source. Secondly, it is desirable that the vacuum channel 26 as it enters pocket 27 be as large as possible while still being entirely covered by a die in such pocket. In other words, the size of the hole entering the bottom of each pocket 27 is determined by both the width of the die being tested and by the amount by which the die can move width-wise within the pocket. The more precisely that the dimensions of the pockets correspond to the dimensions of the dies (particularly the width dimension), the larger the channel hole 26 can be in relation the width dimension of die 11. For dies 11 having a width of about 1.0 millimeters when placed in a wafflepack 20 having pockets 27 about 1.3 millimeters wide, through holes of about 0.46 millimeters are expected. Another factor affecting the efficacy of the vacuum draw is the quality of the seal between the vacuum fixture and the edges of wafflepack 20. Assuming that wafflepack 20 is comprised of a flat, rigid, and smooth material such as polished aluminum, then an acceptable vacuum seal is likely to result if the vacuum fixture comprises a compliant sealing element.

Compared to prior art die storage trays such as wafflepack 16, wafflepack 20 greatly improves the ability to stably hold discrete dies during probing, scraping, and testing. In part, this improvement is due to the flat surface provided by a flat base plate 21 that does not deform during machining and handling of raised plate 22. Such a flat bottom prevents the teeter-totter motion enabled by the uneven bottoms of prior art pockets. Also, a flat bottom together with sharp bottom corners without radii along the bottom edges reduces the likelihood that the die will move from its predicted position during scraping by the test probe. A flat bottom further aids the ability to seal a die to its vacuum channel when a vacuum is drawn, thereby further enhancing the stability of the dies held in their respective pockets.

Figure 2:
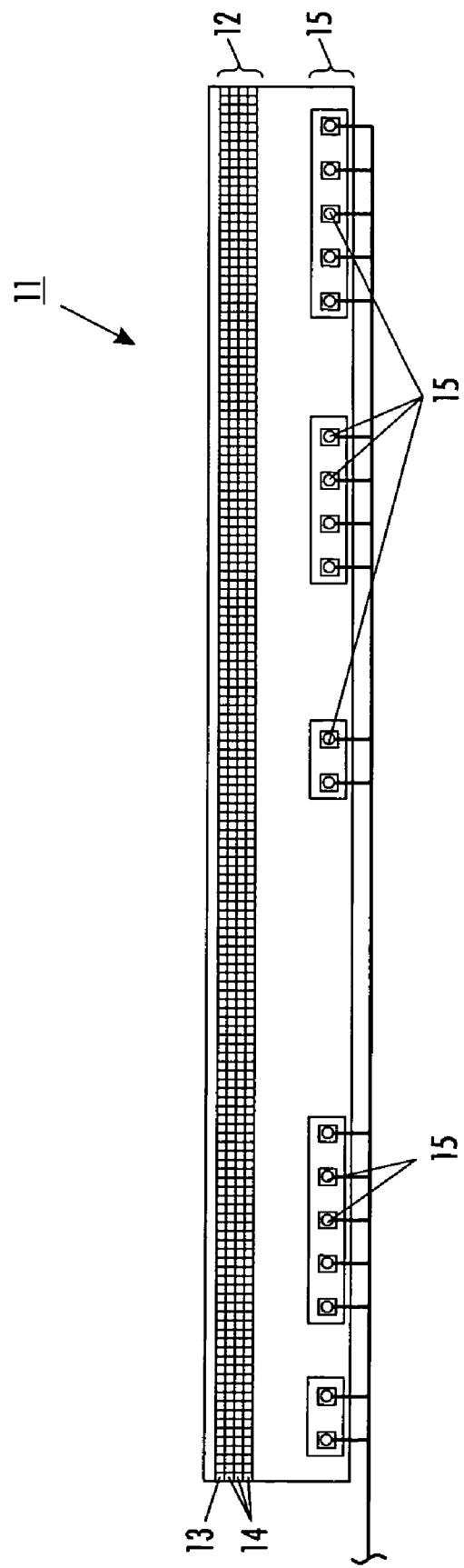
FIG. 2 is an elevated orthogonal view of a single die suitable for manufacturing into a full-width scanner array.
Figure 3:
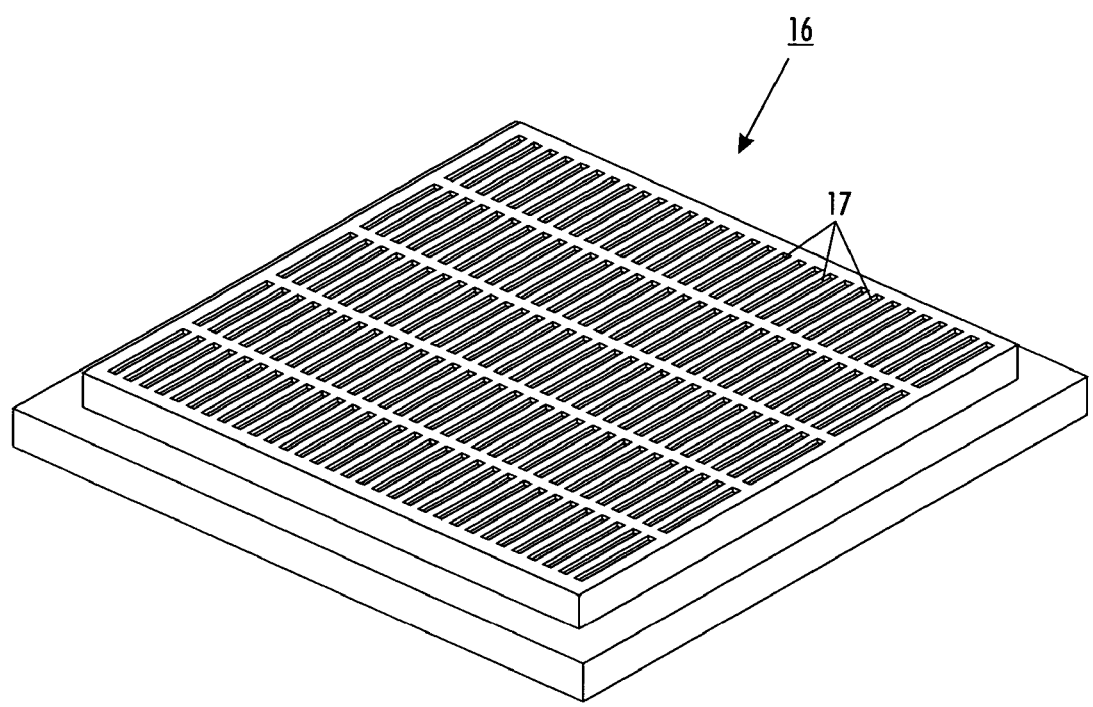
FIG. 3 is an elevated perspective view of a die holding wafflepack tray of the prior art.

For chips (or dies) of reasonable width, the wafflepack embodiment of FIG. 4 is sufficient to securely hold each die 11 within its respective pocket 27 during probing, scraping, and testing. Chips that are 3 millimeters wide or wider should be sufficiently held by vacuum and by the flatness of the of the pocket bottoms provided that the width and length dimensions reasonably conform to the dimensions of the chips. The width of such chips, coupled with the flatness of the pocket bottom, provides suitable stability once pulled by a vacuum. For narrower chips with width dimensions less than 3 millimeters, and particularly those chips with a width dimension approaching about 1 millimeter or less, the wafflepack arrangement shown in FIG. 4 may not be sufficient. Narrower chips are often used in various imaging-related arrays, and scanning dies such as die 11 shown in FIG. 2 may be between about 1.5 millimeters and 0.7 millimeters wide and between about 14 to 20 millimeters long. The narrower width is particularly problematic for dies such as die 11 where contact pads such as pads 15 are offset from the centerline of the length dimension. During the scraping or scrubbing of the pads by the probe, the off-center pressure upon the pads makes the dies particularly susceptible to shifting if any space remains between the dies and the walls of grooves 23.

Figure 5:
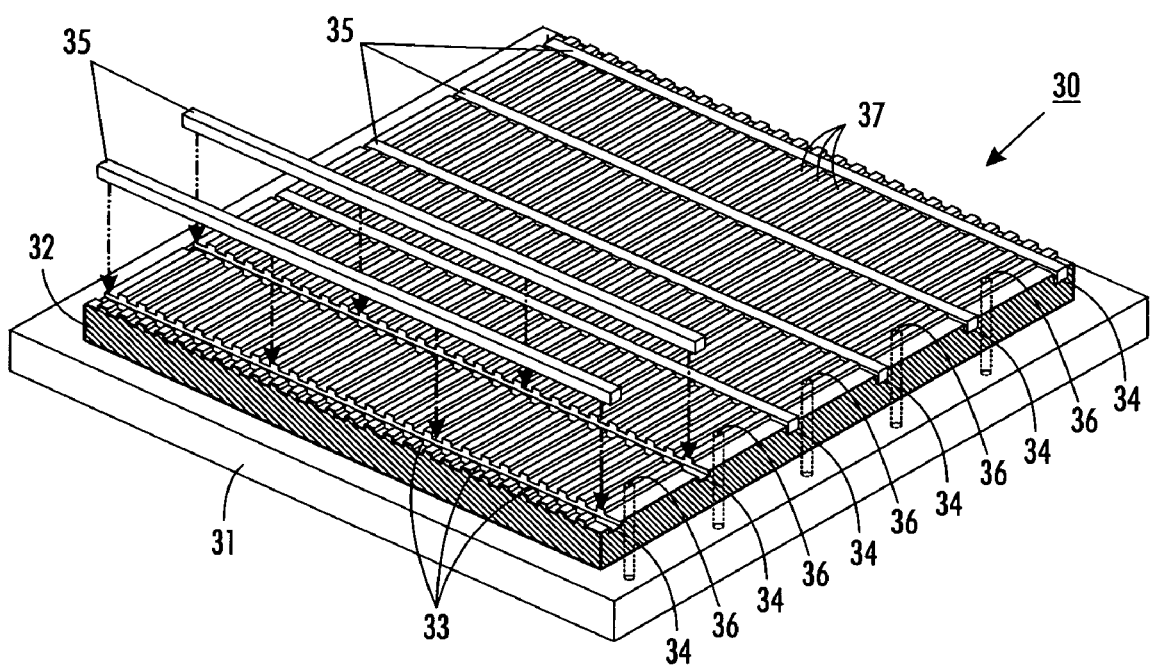
FIG. 5 is an elevated perspective view of another embodiment of a die holding wafflepack tray of the present invention.

For narrower dies or chips having a width dimension less than 3 millimeters, the wafflepack embodiment shown in FIG. 5 may be more suitable. In this embodiment, wafflepack 30 resembles wafflepack 20 shown in FIG. 4 except that raised plate 32 is comprised of a compliant material suitable for machining lateral grooves 33 and longitudinal grooves 34. One such material is an anti-static high-grade neoprene rubber of durometer 60 A. This material can be attached to base plate 31 using any suitable method of bonding, including a probond glue such as Elmers Probond™ Contractor Premium Polymer glue. After curing in order to firmly mount raised plate 32 to base plate 31, grooves 33 and 34 are machined in the manner described in relation to wafflepack 20 shown in FIG. 4. Although the compliant material of raised plate 32 is deformable by itself, bonding to a flat metallic or similar rigid flat plate 31 results in even and flat bottoms to each pocket 37. Vacuum channel holes 36 are then cut in the same manner as described in relation to wafflepack 20 in FIG. 4. Next, grooves 33 of raised plate 32 are deburred by a polishing operation to ensure that any burs remaining from the machining operation are removed. Manufacture of wafflepack 30 is then completed by filling longitudinal grooves 34 with strips 35, which may be made of the same material as used in relation to wafflepack 20. Such strips are preferably longer than machined grooves 34 and are trimmed to length once inserted. A rigid metal such as aluminum may also suffice as a material for the strips. The result is a wafflepack with flat bottoms and orthogonal walls equivalent to wafflepack 20 shown in FIG. 4 but with pockets comprised of compliant material.

An advantage of a wafflepack comprising a machined raised plate 32 of compliant material is that each die is held more firmly in its pocket by an improved seal under vacuum. Although a rigid smooth metal surface may suffice, tests indicate that a compliant material such as neoprene enables a better vacuum seal between the die 11 and the vacuum channel 36. Additionally, many compliant materials such as neoprene also have a high co-efficient of friction. For instance, the co-efficient of friction between neoprene on glass is measured at 1.4, which is over three times the co-efficient of friction between glass on aluminum. A co-efficient of about twice that of glass on aluminum is thought sufficient. This increased friction significantly aids in stabilization of the dies once inserted into the pockets. When coupled with a vacuum pulled through channels 36, even narrow die chips are held firmly in place and can be successfully tested while held in the wafflepack. The result is an improved wafflepack that enables dies and chips to be probed and tested after cutting and sorting but before being assembled into final packaging.

Figure 6:
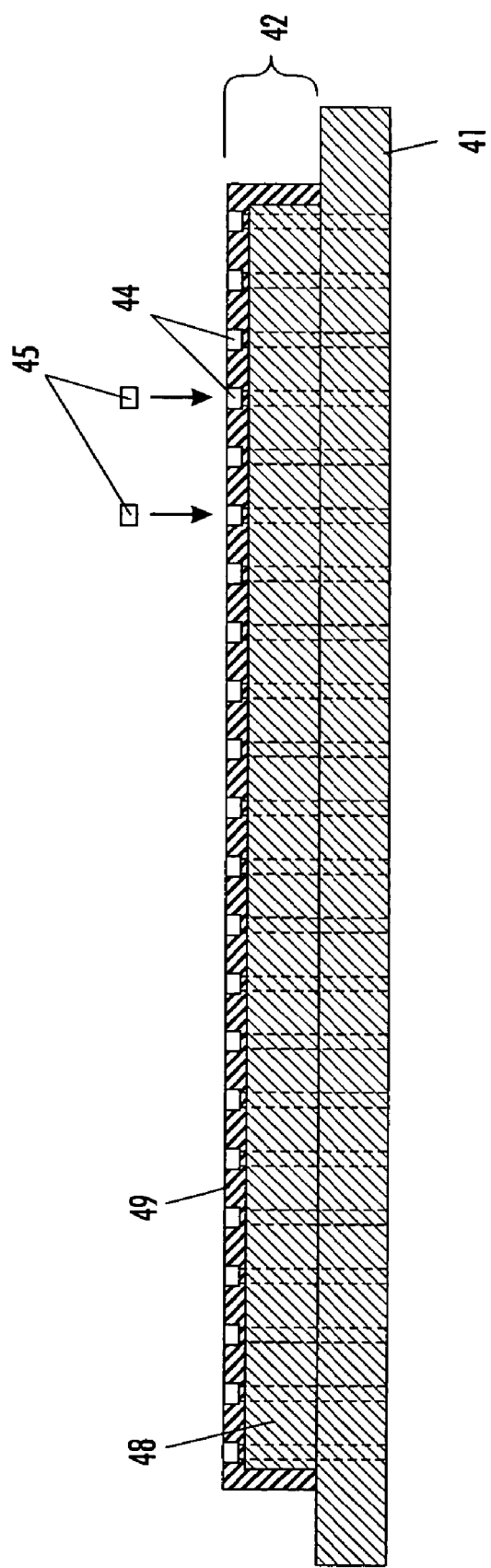
FIG. 6 is a cross-sectional view of another embodiment of a die holding wafflepack tray of the present invention.

Referring now to FIG. 6, a cross-sectional view of another wafflepack storage tray of the invention is shown as wafflepack 40. Wafflepack 40 is identical to wafflepack 30 shown in FIG. 4 except that raised plate 42 in FIG. 6 comprises an inner stage 48 of aluminum or other rigid material that typically is made of the same material and same body as base support plate 41. Inner stage 48 is capped, or covered by top plate 49 that is comprised of a compliant material such as neoprene as described in relation to FIG. 4. Top plate 49 is thick enough to machine grooves 44 and 43 (grooves 43 not shown) in the same manner and dimensions as described in relation to FIG. 4. Strips 45 fill grooves 44 in the same manner as described above.

The difference between wafflepack 30 and wafflepack 40 is that the compliant layer is thinner in wafflepack 40. The result is that the pockets in wafflepack 40 are more stable than the pockets in wafflepack 30. Additionally, the neoprene or other compliant material need only be about 0.10 to 0.20 millimeters thick between the bottom of pockets 47 and the top of inner stage 48. This very thin layer allows heat to dissipate quickly through the bottom of each pocket. Thus, when temperatures are raised during probing and testing to between 50 and 60 degrees Centigrade as described earlier, such temperatures are quickly conducted away into a thermally conductive base 41 and inner stage 48. This enables easier handling and minimizes the time at which the silicon remains at an elevated temperature.

The result of using wafflepacks 20, 30 or 40 is improved efficiency and lower cost. By eliminating defective dies before expensive final packaging, greater efficiency and lower costs result. In the case of full-width arrays, this means that defective dies can be excluded before being edge butted and assembled into a final full-width array. The number of assembled arrays that then need to be reworked or discarded is greatly reduced. Additionally, by enabling effective testing while the dies are stored in the wafflepack storage trays, testing of the dies while in situ in the wafer may be eliminated. Removal of this process before the wafer is cut may be particularly efficient for those die-making operations that have relatively high yields with few defective dies while in situ on the wafer.

In order to perform probing, scraping, and testing of dies while held in a wafflepack or similar storage tray, an improved vision system is needed by the probe and testing apparatus. When dies such as dies 11 in FIG. 1 are tested in situ in a wafer before being cut, the task of the imaging system that directs the probe into simultaneous contact with each of the pads 15 of each die is simplified since each die is situated in a known and close relationship to its neighboring dies. Although the positions of dies within pockets such as 37 in FIG. 5 or 27 in FIG. 4 is relatively known, the precision is necessarily less than when these dies were in situ within a wafer. Indeed, the dies are likely to be situated at slightly different angles, or skews, within their respective pockets. Also, precise imaging is made more difficult because the dies are spaced further apart by grooves such as grooves 33 and 34 in FIG. 5. The greater distance the probe and its imaging system must travel, the more error is introduced into the direction of travel. The imaging system must be robust enough to accommodate these increased tolerances and adjust accordingly.

Figure 7:
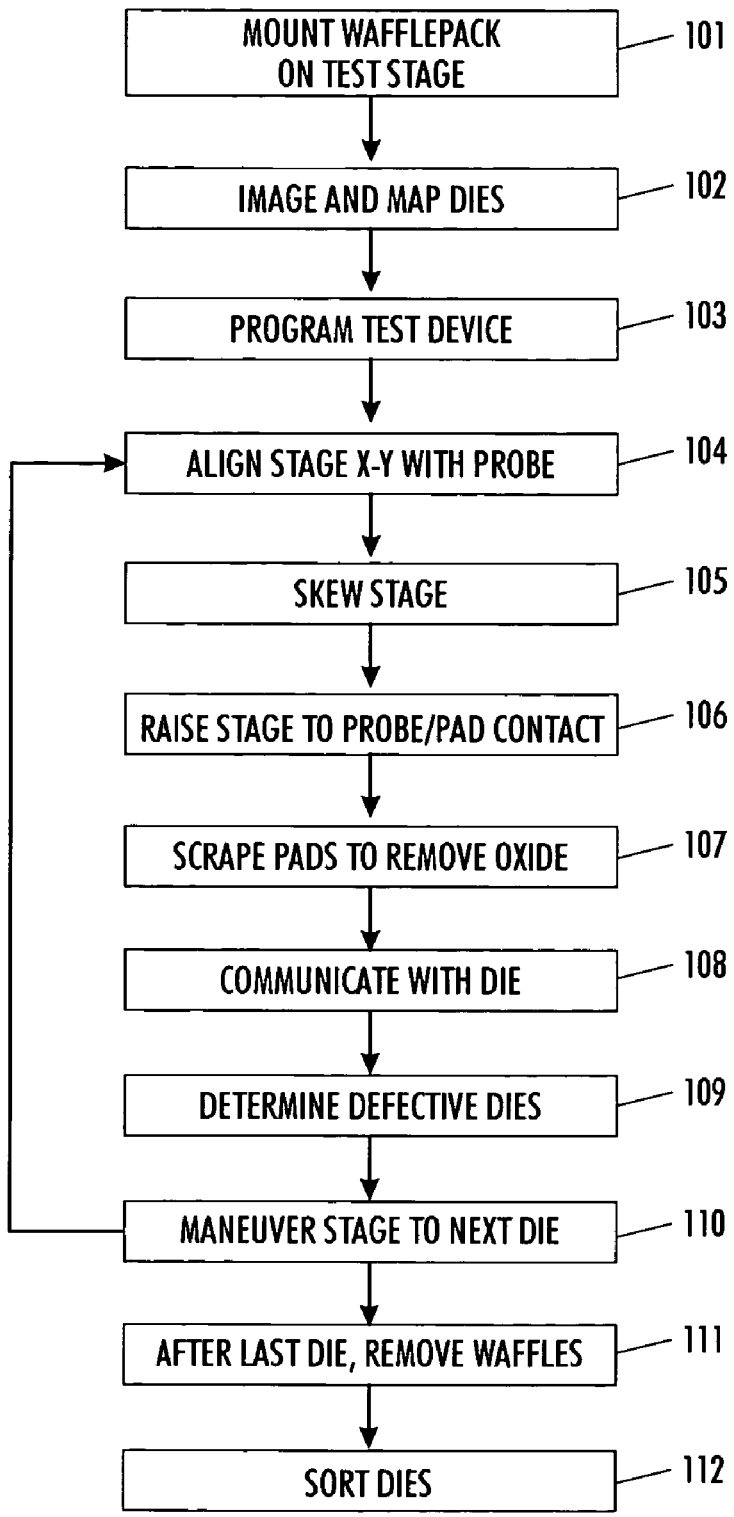
FIG. 7 is a flow chart of an embodiment of a process of the present invention.

Accordingly, one embodiment of the invention is enhanced processes for testing dies using the improved storage trays described above. In particular, the automated vision system, its mapping, and programming of the test probe equipment is enhanced over the comparable systems used when probing and testing dies in situ on a wafer. Instead of simply locating several positional markings and extrapolating the precise position of all dies and pads from such positional markings (which is possible when dies are in situ on a wafer), the imaging system must identify and map the position and skew of each die within its respective pocket. In relevant devices made by Electroglas, Inc., the wafflepack containing dies is mounted on a stage of the test device. This step is shown as step 101 in FIG. 7. Once secured, the wafflepack and its dies are imaged, analyzed, and mapped as indicated in step 102. At step 103, the map is programmed into the test and probe device. At step 104, the stage maneuvers under the stationary probe to align itself in an X-Y grid over the die selected to be tested. At step 105, the skew of the stage is turned to match the skew of the die in its pocket. At step 106, the stage is raised in order to raise the pads on the relevant die into contact with the probes. At step 107, the probes perform the scraping or scrubbing motion in a conventional fashion. At step 108, electrical signals are transferred between the die and the probe during the test procedure. At step 109, software in the test device determines whether the die tests properly or is likely defective. At step 110, the stage maneuvers in a step-and-repeat fashion to the next die to be tested, and the process repeats itself. At step 111, the last die has been tested, and a wafflepack map of defective and non-defective dies is made. At step 112 the wafflepack storage tray can be removed. At step 113, dies are sorted between defective and non-defective dies. Importantly, as noted above, the improved process described above can eliminate the step of probing and testing while the dies are still in situ on the wafer. Elimination of the in situ probe and testing step further enhances the efficiency and cost savings made possible by the present invention.

In review, the improved die storage trays and processes of the present invention, when compared to the prior art, enable another set of tests to ensure the quality of dies after cutting and, optionally, initial in situ testing and probing but before dies are assembled into expensive final packaging. Embodiments of the invention are particularly suitable for long and narrow dies such as used in many imaging applications, including full-width arrays. Using the improved wafflepack storage tray embodiments of the present invention, an improved and more efficient test procedure is made possible.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for testing dies, comprising:
   placing a plurality of dies in a die holding tray;
   mounting the holding tray to a mounting stage of an imaging and testing apparatus;
   drawing a partial vacuum through channels communicating between the bottom of die pockets in the die holding tray and a vacuum source;
   using an automated vision system to map the position of dies held in the holding tray;
   with the use of the map, moving the mounting stage in relation to a test probe to the approximate position of an individual die held in the holding tray;
   skewing the mounting stage in relation to the test probe to align the probe with a plurality of pads of the die;
   contacting the pads with the test probe; and
   testing the die with the test probe by sending and receiving electrical signals.

2. The testing method of claim 1, further comprising scraping the pads with the probe prior to testing.

3. The testing method of claim 1, further comprising designating the dies after the testing between defective and non-defective dies, if any dies are defective.

4. The testing method of claim 3, wherein the probing and testing is the first probing and testing of individual dies in the process of producing finished products comprising the dies.

5. The testing method of claim 1, further comprising heating the dies to between 50 and 60 degrees Centigrade while held in the holding tray mounted on the imaging and test apparatus.

6. The testing method of claim 1, wherein moving further comprises moving the mounting stage in relation to the test probe within an X-Y grid.

7. The testing method of claim 1, further comprising programming the testing apparatus with the map.

8. The testing method of claim 1, wherein contacting further comprises raising the mounting stage in relation to the test probe.

9. The testing method of claim 1, wherein the die holding tray comprises a rigid base support member;
   a generally top planar surface supported by the base support member, said top surface having a set of machined lateral grooves and a set of machined longitudinal grooves, said grooves being spaced apart by an amount approximately corresponding to the dimensions of the dies to be held in the tray;
   a plurality of strips sized to fill one set of the grooves and placed in the one set of grooves, thereby forming pockets for receiving dies, said pockets having a bottom and two side walls comprising a segment of an unfilled machined groove and end walls comprising segments of the sides of the strips; and
   vacuum channels communicating into the bottom of the pockets for enabling a vacuum to be drawn upon dies in the pockets in order to enhance the tray holding capability.

10. The testing method of claim 9, wherein the top surface comprises a compliant material.

11. The testing method of claim 9, wherein the top surface comprises a material having a high co-efficient of friction.

12. The testing method of claim 1, wherein the size of the vacuum channels as they enter the bottom of the pockets is essentially the largest size such channels can be while ensuring that the dies that are intended for the pockets cover the channels when the dies are placed against either side wall of the pocket.

13. The testing method of claim 1, wherein the dies are less than about 3 millimeters wide.

14. The testing method of claim 1, wherein the dies are less than about 1.5 millimeters wide.

15. The testing method of claim 1, wherein the dies are less than about 1 millimeter wide.

16. The testing method of claim 1, wherein the dies have a center line parallel to the length dimension and having contact pads significantly off-center from the center line.

17. The testing method of claim 1, wherein the dies are useful for imaging applications.

18. The testing method of claim 1, wherein the dies sense electromagnetic energy.

19. The testing method of claim 1, wherein the dies are optimized for use in a full width array.

20. The testing method of claim 1, wherein the dies are optimized for use in a scanner bar.

21. The testing method of claim 1, further comprising mapping the placement of defective dies placed in the storage tray, if any dies are defective.

22. A method for testing dies, comprising:

placing a plurality of dies in a die holding tray;

mounting the holding tray to a mounting stage of an imaging and testing apparatus;

drawing a partial vacuum through channels communicating between the bottom of die pockets in the die holding tray and a vacuum source;

using an automated vision system to map the position of dies held in the holding tray;

with the use of the map, moving the mounting stage in relation to a test probe to align the probe with the pads of the die;

contacting the pads with the test probe; and testing the die with the test probe by sending and receiving electrical signals.

* * * * *